US006951709B2

(12) United States Patent
Li

(10) Patent No.: US 6,951,709 B2
(45) Date of Patent: Oct. 4, 2005

(54) METHOD OF FABRICATING A SEMICONDUCTOR MULTILEVEL INTERCONNECT STRUCTURE

(75) Inventor: Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 10/137,384

(22) Filed: May 3, 2002

(65) Prior Publication Data

US 2003/0207207 A1 Nov. 6, 2003

(51) Int. Cl.[7] .................................................. G03F 7/00
(52) U.S. Cl. ...................... 430/316; 430/313; 430/317; 430/394
(58) Field of Search ......................... 430/311, 313, 430/316, 317, 318, 394, 396

(56) References Cited

U.S. PATENT DOCUMENTS

| 6,194,128 B1 | * | 2/2001 | Tao et al. .................... 430/313 |
| 6,291,334 B1 | | 9/2001 | Somekh ...................... 438/620 |
| 6,297,554 B1 | | 10/2001 | Lin ............................. 257/752 |
| 2003/0049388 A1 | * | 3/2003 | Cho et al. .................... 427/569 |

* cited by examiner

Primary Examiner—Kathleen Duda
(74) Attorney, Agent, or Firm—Dickstein Shapiro Morin & Oshinsky LLP

(57) ABSTRACT

A method of fabricating a semiconductor multilevel interconnect structure employs a dual hardmask technique in a dual damascene process. The method includes using amorphous carbon as a first hardmask layer capable of being etched by a second etch process, and a second hardmask layer capable of being etched by a first etch process, as a dual hardmask. By virtue of the selective etch chemistry employed with the dual hardmask, the method affords flexibility unattainable with conventional processes. The via is never in contact with the photoresist, thus eliminating residual photoresist at the trench/via edge and the potential "poisoning" of the intermetal dielectric layer. Since trench/via imaging is completed before further etching, any patterning misalignments can be easily reworked. Because the amorphous carbon layer and the second hardmask layer are used as the dual hardmask, the photoresist can be made thinner and thus optimized for the best imaging performance.

42 Claims, 27 Drawing Sheets

| FIG. 3A |
| FIG. 3B |
| FIG. 3C |

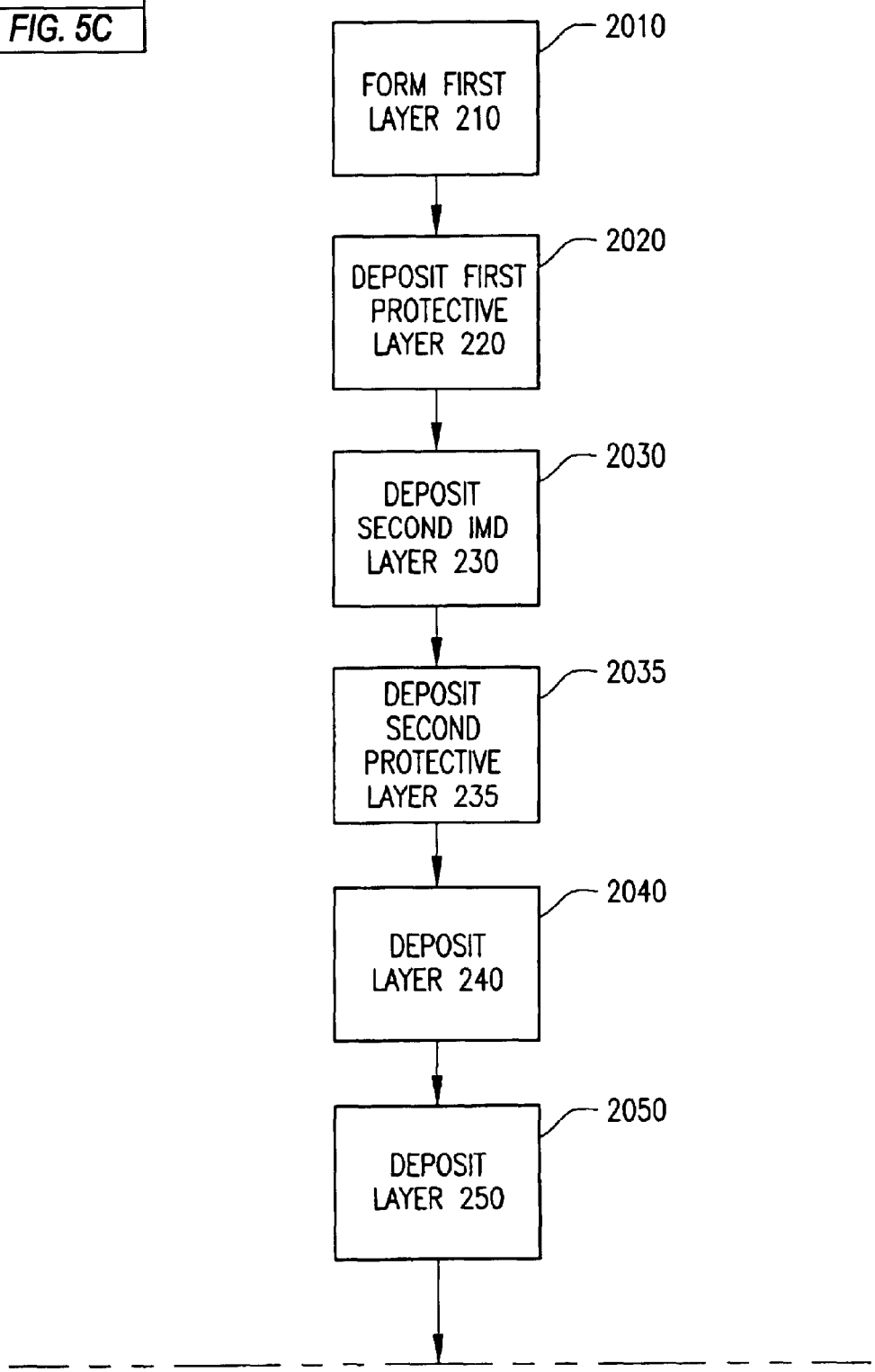

METHOD OF FABRICATING A SEMICONDUCTOR MULTILEVEL INTERCONNECT STRUCTURE

BACKGROUND OF THE INVENTION

1. Field of the Invention

This invention relates generally to the field of semiconductor memory and logic devices. The invention relates more specifically to a method of fabricating a semiconductor multilevel interconnect structure, as well as the resulting structure.

2. Description of the Related Art

In order to improve the speed of semiconductor devices on integrated circuits, it has become desirable to use conductive materials, such as copper, having low resistivity and low k (a dielectric constant of less than 4.0) in order to reduce the capacitive coupling between structures such as interconnect lines.

Because materials such as copper are difficult to etch in a precise pattern, a method of fabrication known as a dual damascene process can be used to form the interconnects. In a conventional dual damascene process, a dielectric layer is etched to define both the contacts and vias, and the interconnect lines. Metal is then inlaid into the defined pattern and any excess metal is removed from the top of the structure in a planarization process, such as chemical mechanical polishing.

In order to provide the interconnects such as those fabricated from copper, various approaches have been proposed. For example, photolithography using an $SiO_2/SiN_x$ dual hardmask for an organic low k dual damascene process is known. In another approach, described in U.S. Pat. No. 6,291,334, a low k etch stop material, such as an amorphous carbon, is deposited between two dielectric layers and is then patterned to define the underlying interlevel contacts/vias. The entire dual damascene structure is then etched in a single selective etch process which first etches the patterned interconnects, then etches the contact/vias past the patterned etch stop. The etch stop has a low dielectric constant relative to a conventional SiN etch stop, thereby minimizing the capacitive coupling between adjacent interconnect lines.

In still another approach, described in U.S. Pat. No. 6,297,554, a dual damascene process is employed to produce a structure having at least one trench in the surface of a dielectric layer, an insulating layer in the trench, and at least one void in the insulating layer. The insulating layer can consist of a low dielectric constant material such as amorphous carbon. The void is used to reduce the effective dielectric constant of the dielectric layer so as to reduce the parasitic capacitance between two adjacent copper wiring lines.

Despite the benefits of using interconnects such as those fabricated from copper, there can be certain drawbacks associated with use of a conventional dual damascene process. First, the conventional process can leave an undesirable "ear" (or "fence" or "fender") formation of photoresist residue at the trench/via edge. FIG. 6 is a partial cross-sectional view of a structure 300 fabricated by a conventional dual damascene process. Once the bulk of the photoresist has been removed, a residue of photoresist 340 may still be left on intermetal dielectric layer (IMD) 310 at each of the trench 330/via 320 edges. The presence of the photoresist residue can adversely affect the performance of the multilevel interconnect.

Secondly, one of the major problems associated with dual damascene integration, especially when a low k IMD layer is used, is the "poisoning" of the IMD which can result from the interaction between the photoresist and the IMD. The poisoning, which occurs during application of the photoresist, arises because a low k IMD material, which is relatively porous, can absorb chemicals associated with the photoresist. The subsequent outgassing of these chemicals during via metallization leads to structural defects in the via. Neither of the above-described conventional dual damascene processes overcomes either of these drawbacks.

Thirdly, another drawback associated with conventional dual damascene processes is their lack of flexibility. For example, with the conventional process, the IMD may be partially etched before the trench and/or via patterning are completed. If there is any misalignment in the trench/via patterning, it cannot be corrected once the IMD has been etched.

Finally, in conventional dual damascene processes, the photoresist is optimized not for imaging performance, but rather, for its etch resistance. That is, because the photoresist must be etch resistant (i.e., relatively thick) in a conventional process, the imaging qualities of the photoresist may be compromised for the benefit of etch performance.

Therefore, a need exists for a method of dual damascene fabrication which not only avoids the formation of residual photoresist and avoids poisoning of the IMD, but which provides flexibility in patterning and provides for optimization of the photoresist for imaging performance.

BRIEF SUMMARY OF THE INVENTION

The present invention provides a method of fabricating a semiconductor multilevel interconnect structure, as well as the resulting structure. More specifically, the present invention provides a dual damascene method of fabrication using a dual hardmask technique that mitigates the above-described deficiencies associated with conventional processes.

Accordingly, the present invention relates to a dual damascene, dual hardmask, method of fabrication using amorphous carbon as a first hardmask layer capable of being etched by a second etch process, and a second hardmask layer capable of being etched by a first etch process. By virtue of the selective etch chemistry employed with the dual hardmask, the present method affords flexibility unattainable with conventional dual damascene processes.

The method includes forming a via and trench associated with the interconnect structure by selectively etching a layer of amorphous carbon as a first hardmask layer capable of being etched by a second etch process, and etching a second hardmask layer capable of being etched by a first etch process. The method also includes using protective layers to isolate intermetal dielectric layers from layers of photoresist applied during the fabrication process.

The present invention is also directed to a structure for use in fabricating a dual damascene opening according to the above-described method of fabrication. The structure includes a first layer comprising a first intermetal dielectric layer and a metal portion; a first protective layer on the first layer; a second intermetal dielectric layer on the first protective layer; a second protective layer on the second intermetal dielectric layer; a layer of amorphous carbon as a first hardmask layer on the second protective layer; a second hardmask layer on the amorphous carbon layer; and a patterned layer of photoresist on the second hardmask layer.

The present method and structure have several advantages over conventional dual damascene processes and structures.

First, by virtue of the protective layers, the via, after being opened, is never in contact with the photoresist. This eliminates the "ear" formation problem at the trench/via edge which results from the presence of photoresist residue on the IMD layer.

Secondly, this processing sequence eliminates the potential "poisoning" of the IMD layer which can result from the interaction between the photoresist and the IMD layer during application of the photoresist.

Thirdly, the photolithographic imaging for both the trench and the via are completed before the IMD etch, so, if necessary, it is easy to rework any patterning misalignments to ensure that both the trench and the via are etched correctly.

Fourthly, the conventional dual damascene requirement that the photoresist be etch resistant is not a constraint with the present method. That is, because the amorphous carbon layer and the second hardmask layer are used as the dual hardmask, the photoresist can be made thinner and thus optimized for the best imaging performance. Finally, because each of the hardmask layers is ultimately removed in the fabrication sequence, they do not impact the final IMD structure.

BRIEF DESCRIPTION OF THE DRAWINGS

These and other features and advantages of the present invention will become more fully apparent from the following detailed description of the exemplary embodiments of the invention which are provided in connection with the accompanying drawings.

FIGS. 5A–C are a flow diagram of the fabrication sequence corresponding to FIGS. 4A–I.

DETAILED DESCRIPTION OF THE INVENTION

Figure 1:
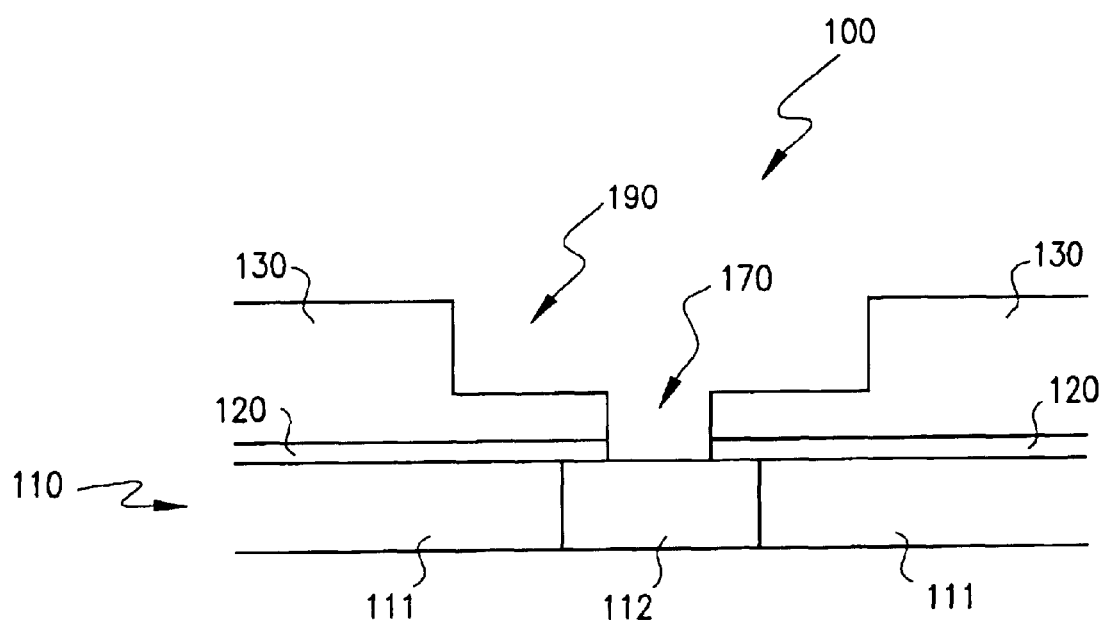
FIG. 1 is a partial cross-sectional view of a structure constructed in accordance with the present invention for use with a multilevel interconnect.

FIG. 1 is a partial cross-sectional view of an interconnect structure 100 constructed in accordance with the present invention for use with a multilevel interconnect. Structure 100, the fabrication of which is described below, includes a first layer 110 having a first intermetal dielectric layer 111 and a metal portion 112; an etched protective layer 120; an etched second intermetal dielectric layer 130; a via 170; and a trench 190. Structure 100 can accommodate the deposition of an inlaid multilevel interconnect metal. As is evident from FIG. 1, structure 100 is characterized by the absence of any undesirable "ear" (i.e., structural formation of resist residue) on the etched IMD layer 130 at the trench/via edge.

Figure 2A:
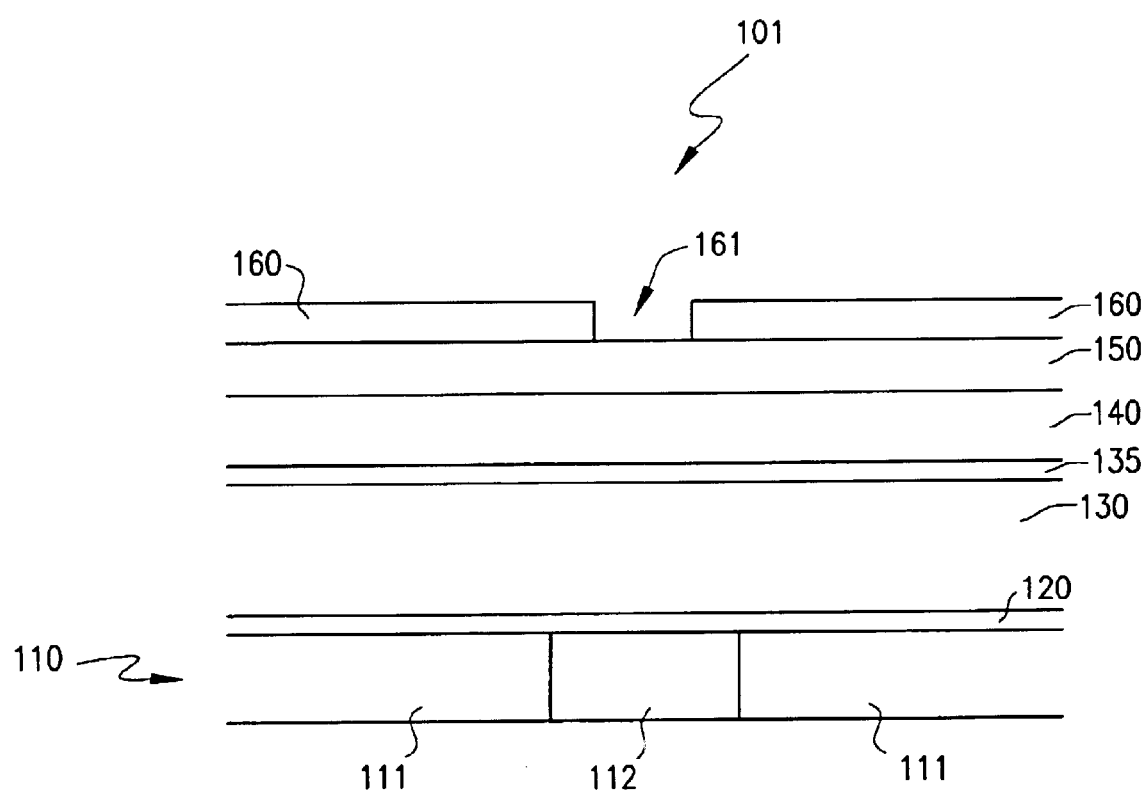
FIGS. 2A–J illustrate a first embodiment of the method of fabricating the structure depicted in FIG. 1.
Figure 2B:
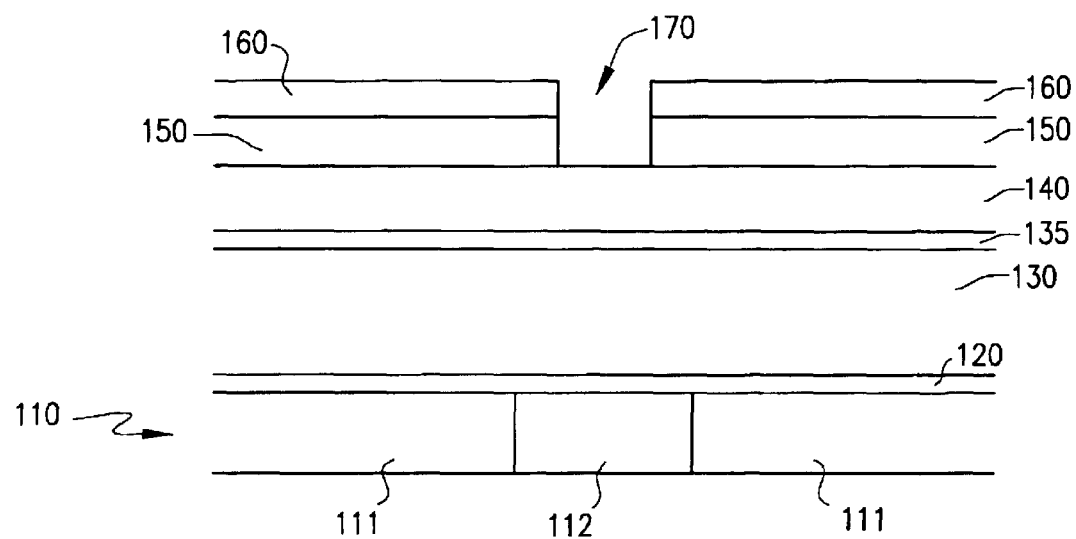
Figure 2C:
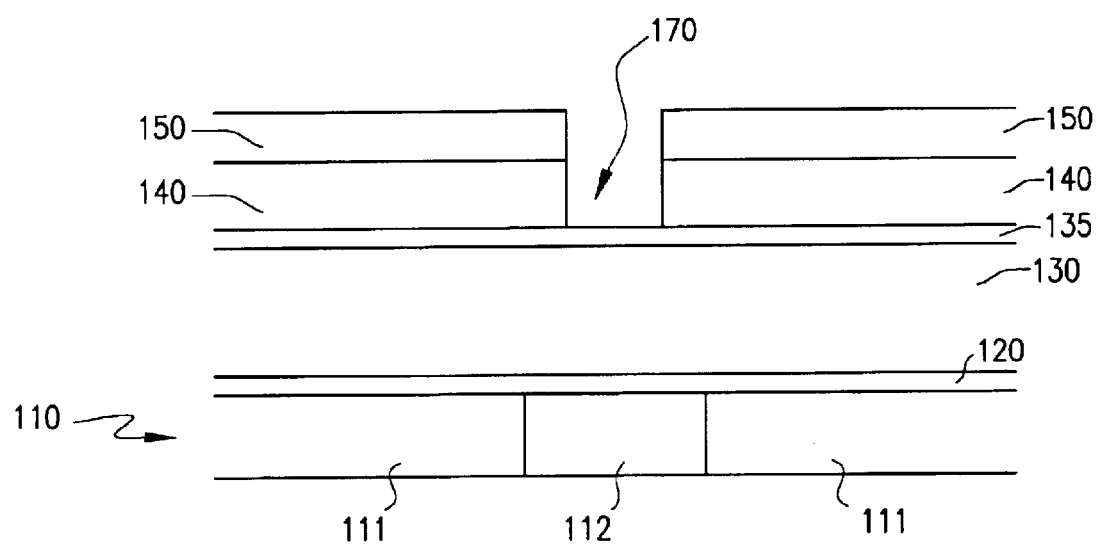
Figure 2D:
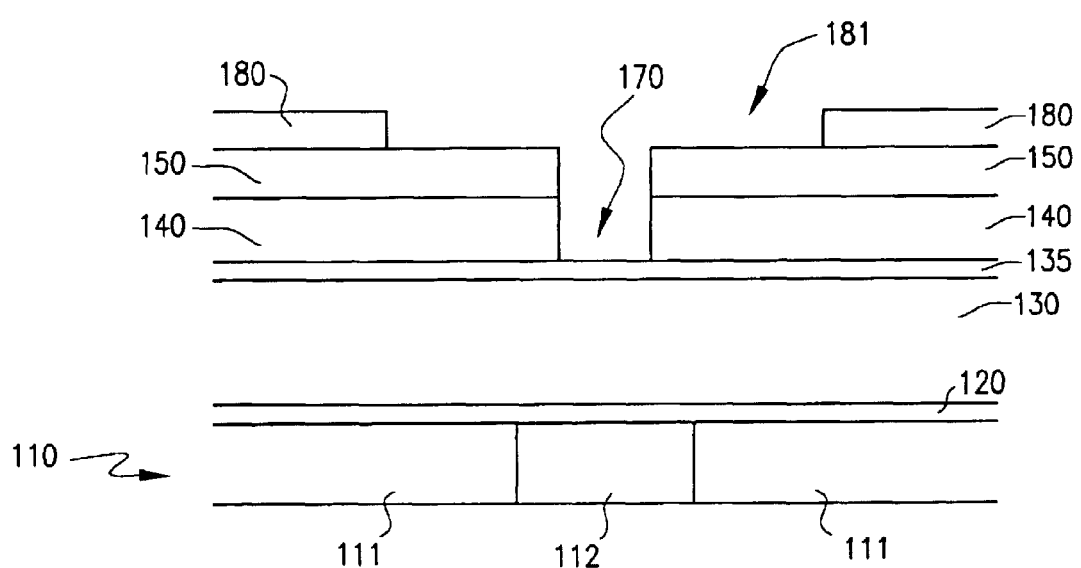
Figure 2E:
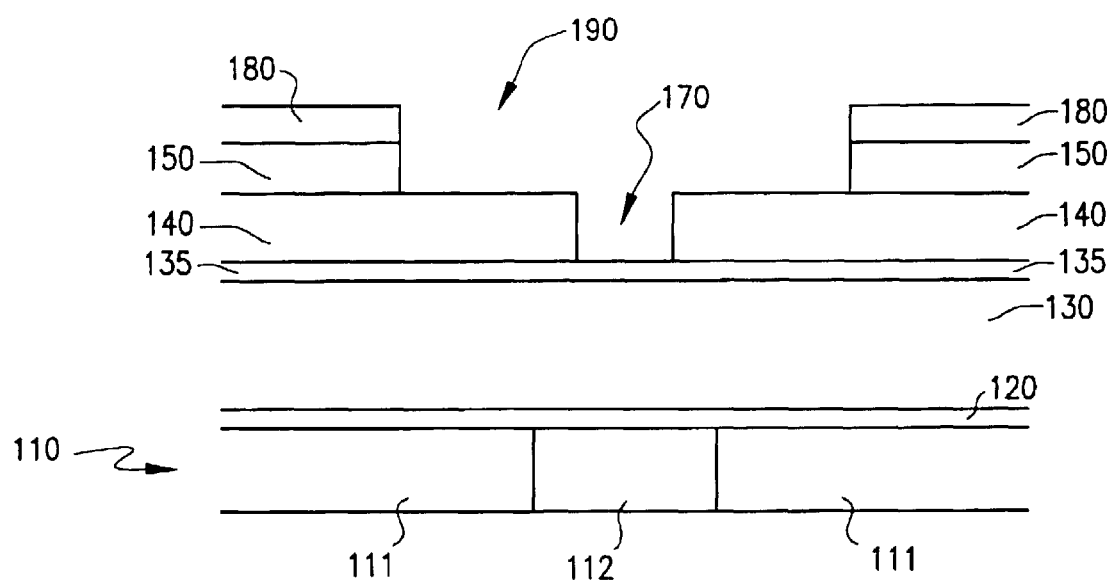
Figure 2F:
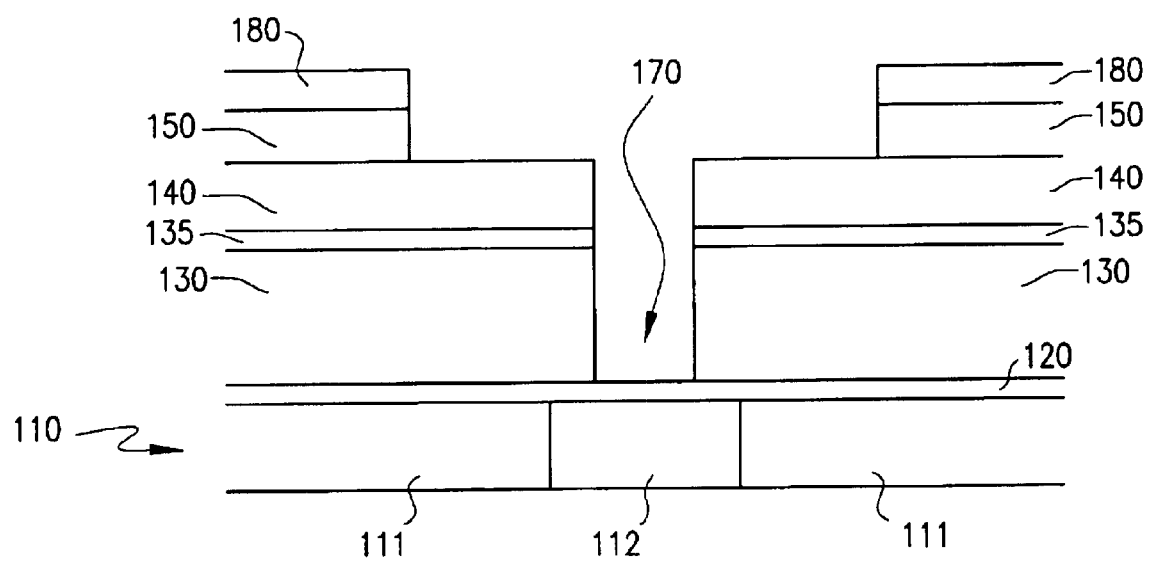
Figure 2G:
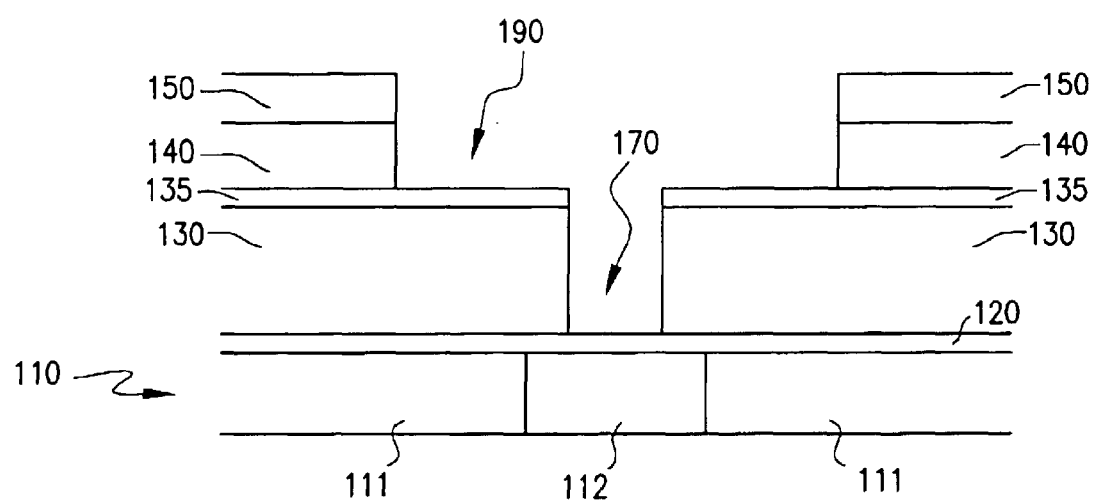
Figure 2H:
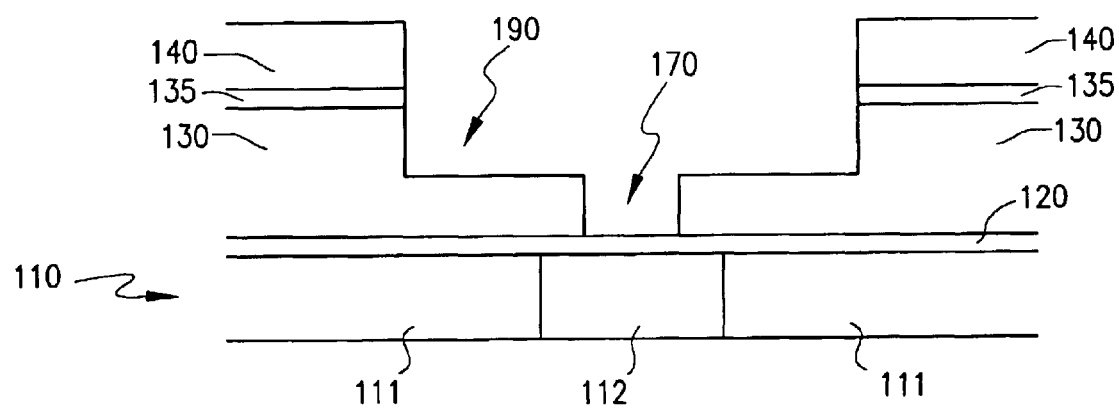
Figure 2I:
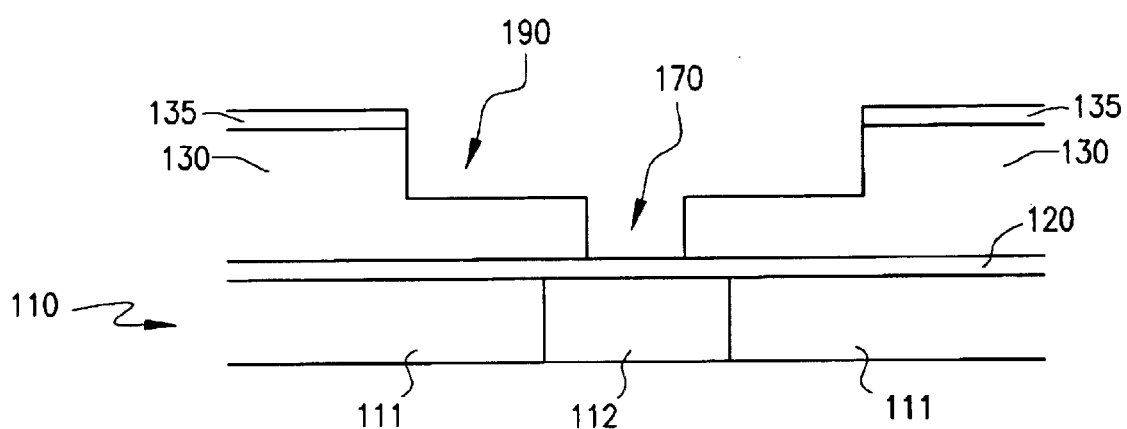
Figure 2J:
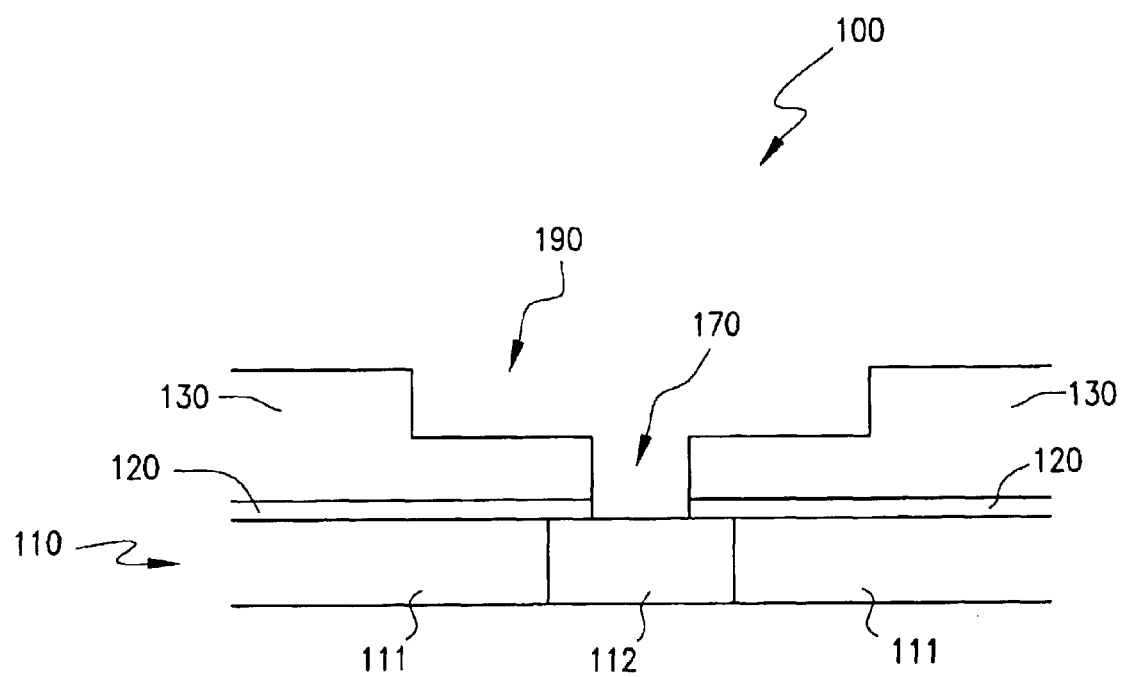
Figures 3, 3A:
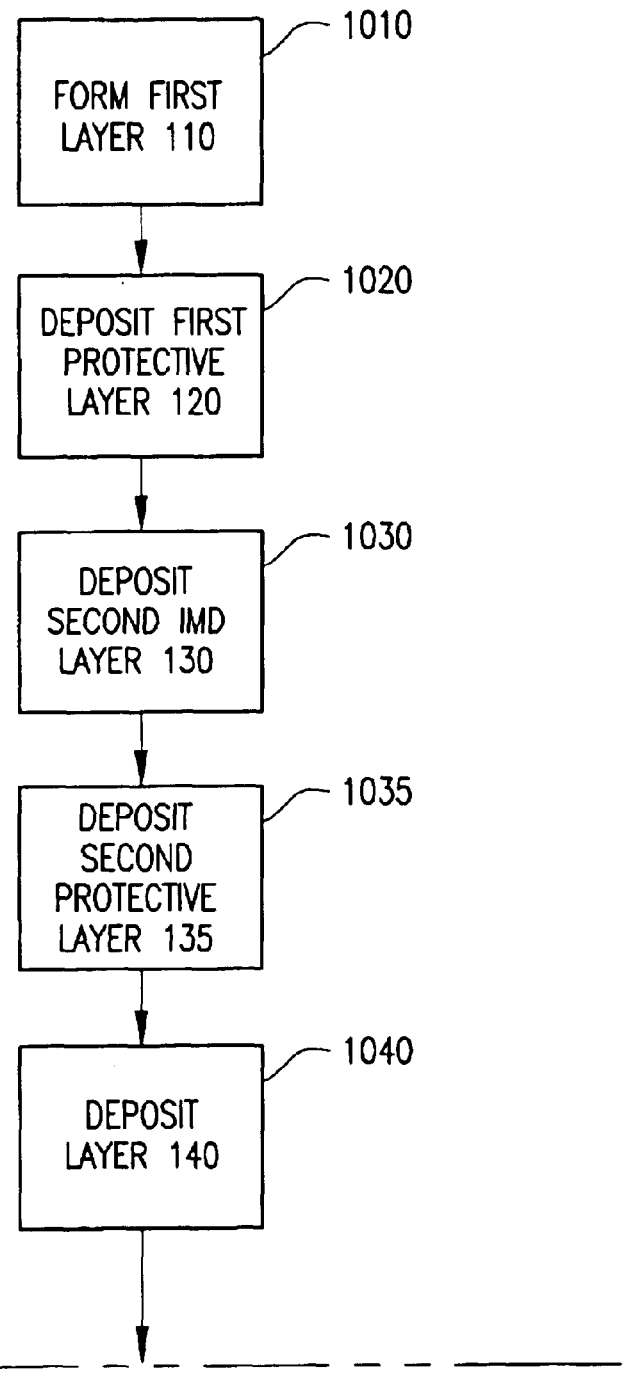
FIGS. 3A–C are a flow diagram of the fabrication sequence corresponding to FIGS. 2A–J.
Figure 3B:
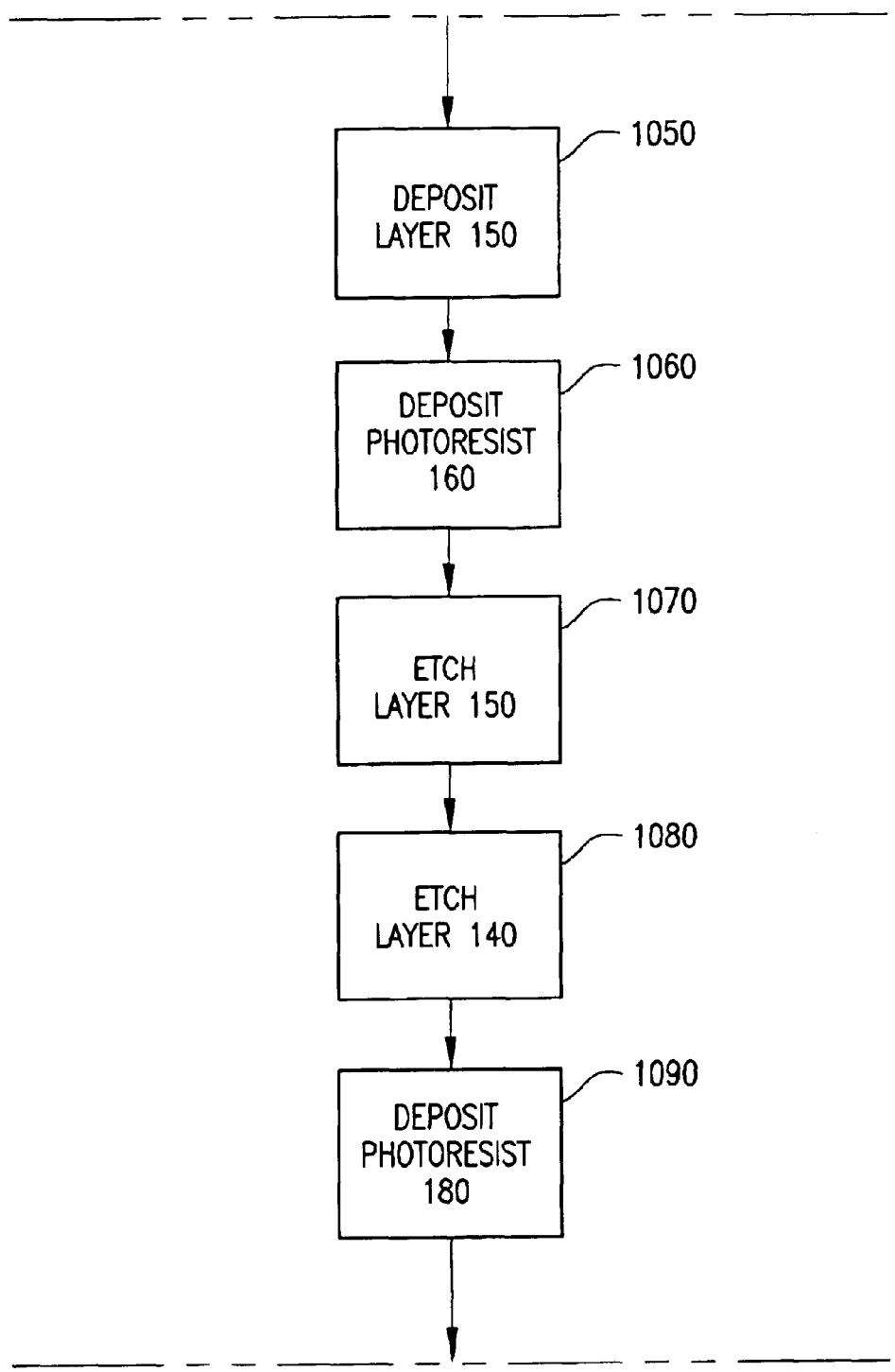
Figure 3C:
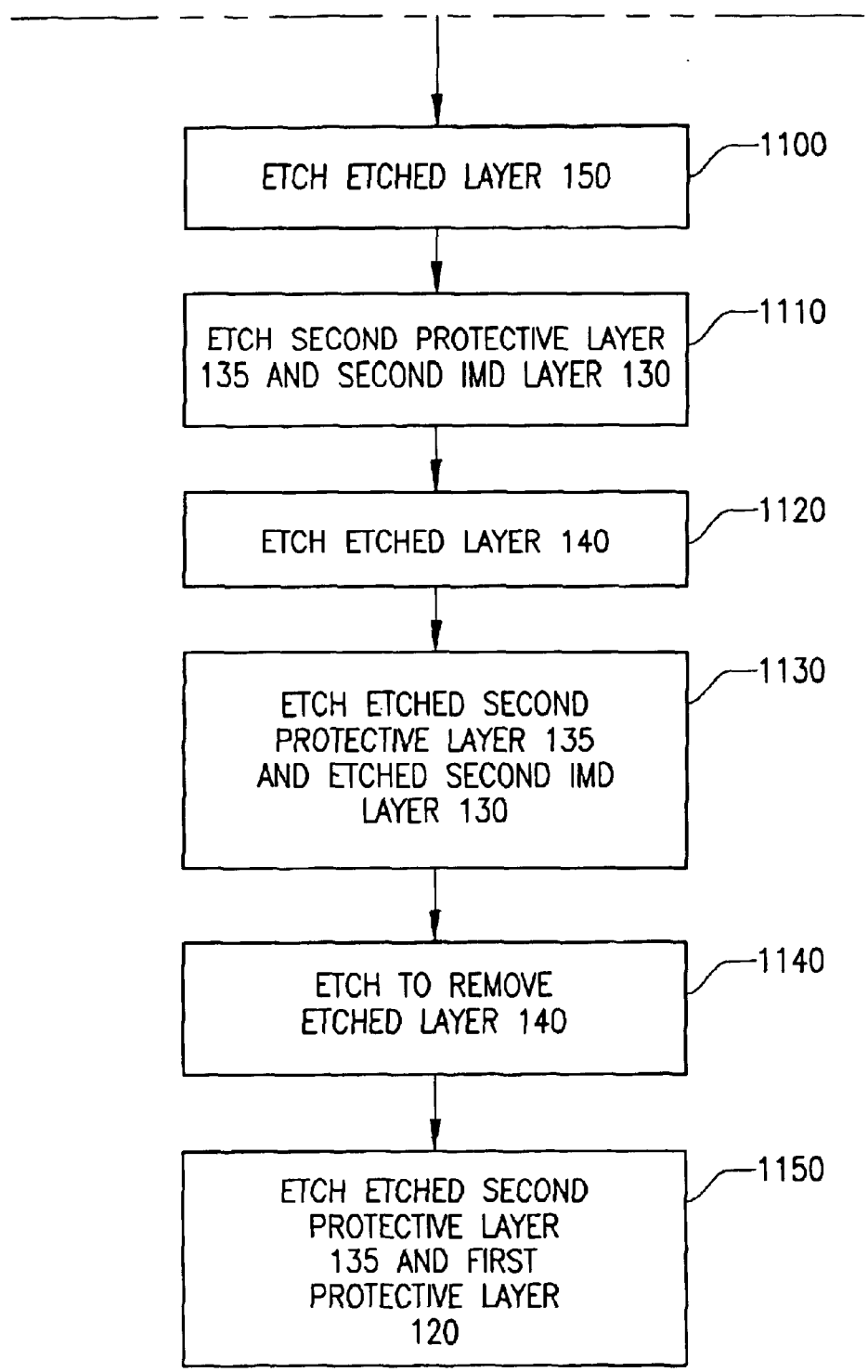

FIGS. 2A–J illustrate a first embodiment of the method of fabricating the structure 100 depicted in FIG. 1. FIGS. 3A–C are a flow diagram of the fabrication sequence corresponding to FIGS. 2A–J. The method includes first assembling a dual hardmask structure to be etched. As depicted in FIG. 2A, a first layer 110 comprising a first intermetal dielectric layer 111 and a metal portion 112 is formed (step 1010). The metal of metal portion 112 may be Cu or any other metal typically employed as a multilevel interconnect. A first protective layer 120 is deposited (step 1020) upon the first layer 110. The first protective layer 120 typically comprises a material selected from the group consisting of silicon nitrides, silicon carbo-nitrides, and silicon carbides.

A second intermetal dielectric layer 130 is deposited (step 1030) upon the first protective layer 120. A second protective layer 135 is deposited (step 1035) upon the second intermetal dielectric layer 130. The second protective layer 135 typically comprises a material selected from the group consisting of silicon oxides, silicon nitrides, silicon carbo-nitrides, silicon carbides, and titanium nitrides. In another embodiment, the second protective layer 135 can be a dielectric antireflective coating. The second protective layer 135 serves to protect the underlying second intermetal dielectric layer 130 from possible contamination associated with exposure to the subsequently-deposited photoresist (described below).

A layer of amorphous carbon as a first hardmask layer 140 capable of being etched by a second etch process (described below) is deposited (step 1040) upon the second protective layer 135. A second hardmask layer 150 capable of being etched by a first etch process (described below) is deposited (step 1050) upon the amorphous carbon layer 140. Then, in the final step of assembling the layered structure prior to etching, a first layer of photoresist 160 is deposited (step 1060) upon the second hardmask layer 150 and patterned with an opening 161 through which etching will occur.

The amorphous carbon layer 140, which can be deposited as a PECVD film, has a very slow etch rate for the etch chemistry associated with the material of the second hardmask layer 150 (i.e., the etch selectivity can be as high as 100:1). Furthermore, amorphous carbon can be easily etched with an etch chemistry (described below) that does not etch the second hardmask layer 150. This unique property of amorphous carbon makes it possible to use, for example, a stack of the amorphous carbon layer 140 and the second hardmask layer 150 as a dual hardmask in the present dual damascene process.

The second hardmask layer 150 typically comprises a material selected from the group consisting of silicon oxides, silicon nitrides, silicon carbo-nitrides, silicon carbides, and titanium nitrides. In another embodiment, the layer of material 150 can be a dielectric antireflective coating.

Next, in the first etching step, a first portion of a via 170 is formed by etching (FIG. 2B)(step 1070) the second hardmask layer 150 using a first etch process. The first etch process, which etches the second hardmask layer 150, typically employs a plasma containing $C_xF_yH_z$. An oxide, for example, can be easily etched by a plasma having $C_xF_yH_z$ (e.g., $CF_4$), but is not etched at all by any of the etchants (described below) that may be used to etch the amorphous carbon layer 140.

In the next via-patterning step, a second portion of the via 170 is formed by etching (FIG. 2C)(step 1080) the amorphous carbon layer 140 using a second etch process. During step 1080, for the following two reasons, the first layer of photoresist 160 is completely consumed. First, the photoresist layer 160 is etched by the same etchant as is the amorphous carbon layer 140. The photoresist layer 160 etches faster than amorphous carbon layer 140 because the amorphous carbon is harder than photoresist. Secondly, because a dual hardmask is employed, and because a second layer of photoresist 180 (FIG. 2D) is employed for subsequent etching steps (described below), the photoresist layer 160 can be a relatively thin layer, having a thickness chosen to provide the optimal photo-imaging performance. The photoresist layer 160 typically has a thickness of from 1000 to 6000 Å.

The second etch process, which etches the amorphous carbon layer 140, typically employs an etchant selected from the group consisting of $O_2$ plasma, $N_2$ and $O_2$ plasma, $N_2O$ plasma, NO plasma, $H_2$ plasma, and $NH_3$ plasma. For example, with $O_2$ plasma, or a plasma of $N_2$ and $O_2$, the layer of material 140 can be easily etched and results in the release of $CO_2$. With $H_2$ plasma or $NH_3$ plasma, the amorphous carbon layer 140 can be easily etched and results in the release of $CH_4$.

Next, before trench patterning is begun, a second layer of photoresist 180 is deposited (FIG. 2D)(step 1090) on the etched second hardmask layer 150 and patterned with an opening 181 through which etching will occur. A first portion of a trench 190 is then formed by etching (FIG. 2E)(step 1100) the etched second hardmask layer 150 through opening 181 using the first etch process. The amorphous carbon layer 140 is an excellent etch stop because amorphous carbon layer 140 is not selectively etched with the etched second hardmask layer 150.

In addition, because of the presence of second protective layer 135, the second intermetal dielectric layer 130 is advantageously never exposed to the photoresist 180, thus avoiding any potential poisoning of the layer 130. This feature of the present invention, therefore, minimizes the potential for poisoning that can arise with conventional processes in which the via is fully opened to the level of the intermetal dielectric layer before the second layer of photoresist is applied, thereby exposing the intermetal dielectric layer to direct contact with the photoresist.

A third portion of the via 170 is then formed by etching (FIG. 2F)(step 1110) the second protective layer 135 and the second intermetal dielectric layer 130 using the first etch process. In this step, the etched amorphous carbon layer 140 is used as a hardmask to effect the via etch through the second protective layer 135 and the second intermetal dielectric layer 130, and some of the photoresist 180 is consumed. The via etch can be a full via etch stop on the protective layer 120 as shown in FIG. 2F, or a partial etch. The second protective layer 135 and the second intermetal dielectric layer 130 are etched with the first etch process, typically by a plasma containing $C_xF_yH_z$ (e.g., $CF_4$).

A second portion of the trench 190 is formed by etching (FIG. 2G)(step 1120) the etched amorphous carbon layer 140 using the second etch process. In this step, the etched second hardmask layer 150 serves as the hardmask, and trench patterning is effected through the etched amorphous carbon layer 140 as the photoresist 180 is completely consumed.

In the next step, trench etching of the etched second protective layer 135 and the etched second intermetal dielectric layer 130 is effected using the first etch process, with the etched amorphous carbon layer 140 serving as the hardmask. Thus, a third portion of the trench 190 is formed by etching (FIG. 2H)(step 1130) the etched second protective layer 135 and the etched second intermetal dielectric layer 130 and thereby removing all of the etched second hardmask layer 150.

The etched amorphous carbon layer 140 is then removed by etching (FIG. 2I)(step 1140) using the second etch process without in any way damaging the etched second intermetal dielectric layer 130. This step of etching to remove the amorphous carbon layer 140 typically employs the above-described etchant selected from the group consisting of $O_2$ plasma, $N_2$ and $O_2$ plasma, $N_2O$ plasma, NO plasma, $H_2$ plasma, and $NH_3$ plasma. Alternatively, the etching to remove the amorphous carbon layer 140 may employ a hot non-plasma etchant selected from the group consisting of $O_2$, $O_3$, $N_2O$, NO, $H_2$, and $NH_3$. Without plasma, however, the etch is isotropic, and the gaseous etchant must be employed at an elevated temperature. Other non-plasma etchants may be employed to remove the amorphous carbon layer 140, such as compounds of the formula $C_xF_yH_z$, but with these etchants the etch rate is much slower than that attainable with either the above-described plasma etchants (i.e., $O_2$ plasma, $N_2$ and $O_2$ plasma, $N_2O$ plasma, NO plasma, $H_2$ plasma, and $NH_3$ plasma) or hot non-plasma etchants (i.e., $O_2$, $O_3$, $N_2O$, NO, $H_2$, and $NH_3$).

The etched second protective layer 135 and a portion of the first protective layer 120 that is disposed above the metal portion 112 are then removed by etching (FIG. 2J)(step 1150) using the first etch process so as to complete the formation of the via 170. The resultant structure 100 is thus ready for deposition of the inlaid interconnect metal.

The etch chemistry of the photoresist layers 160 and 180 is similar to the etch chemistry of the amorphous carbon layer 140, but the photoresist etches faster because amorphous carbon is harder than photoresist. As indicated above, in conventional dual damascene processes, the photoresist is optimized not for imaging performance, but rather, for its etch resistance. That is, because the photoresist must be etch resistant (i.e., relatively thick) in a conventional process, the imaging qualities of the photoresist may be compromised for the benefit of etch performance. An advantage of the present invention is that because the amorphous carbon layer 140 and the second hardmask layer 150 are used as the dual hardmask, the photoresist can be made thinner and thus optimized for the best imaging performance.

FIGS. 4A–I illustrate a second embodiment of the method of fabricating the structure 100 depicted in FIG. 1. FIGS. 5A–C are a flow diagram of the fabrication sequence corresponding to FIGS. 4A–I. As with the first method embodiment, the method includes first assembling a dual hardmask structure to be etched. In this second embodiment of the method, the first five steps of assembling the layered structure (steps 2010, 2020, 2030, 2040, and 2050) are identical to the first five steps described above (steps 1010, 1020, 1030, 1040, and 1050) for the first embodiment of the method of fabrication.

Figure 4A:
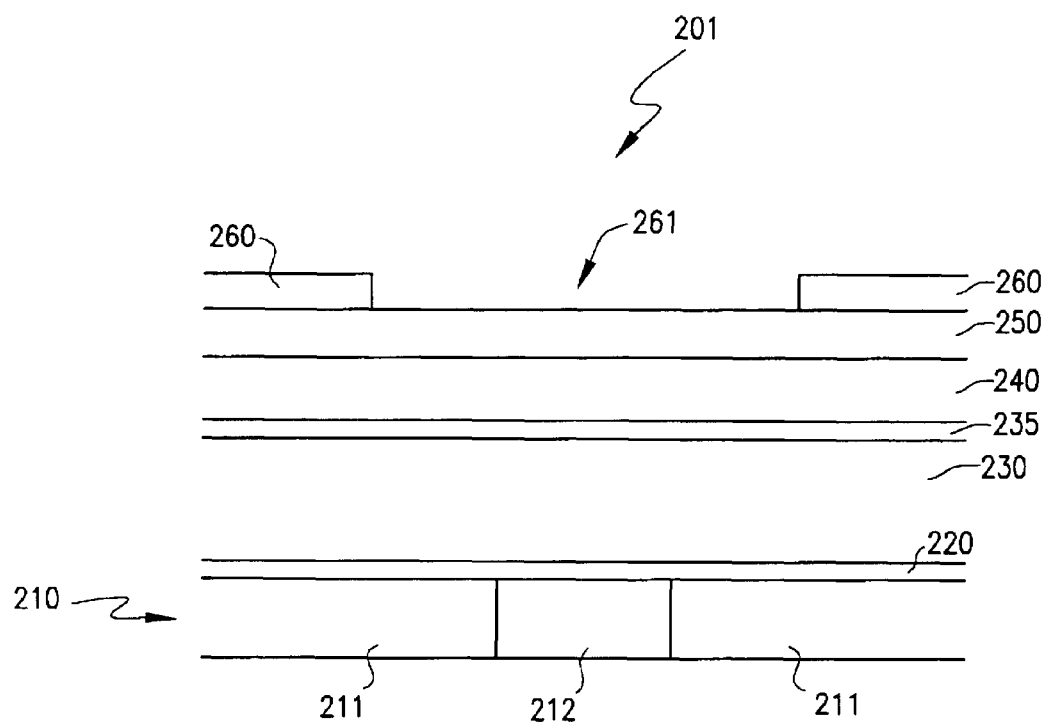
FIGS. 4A–I illustrate a second embodiment of the method of fabricating the structure depicted in FIG. 1.
Figure 4B:
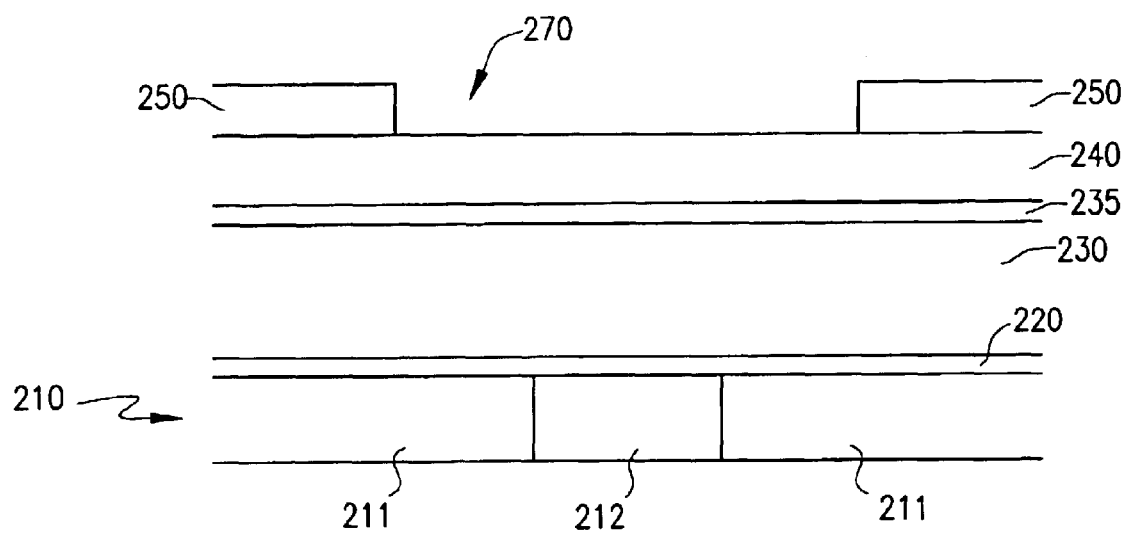
Figure 4C:
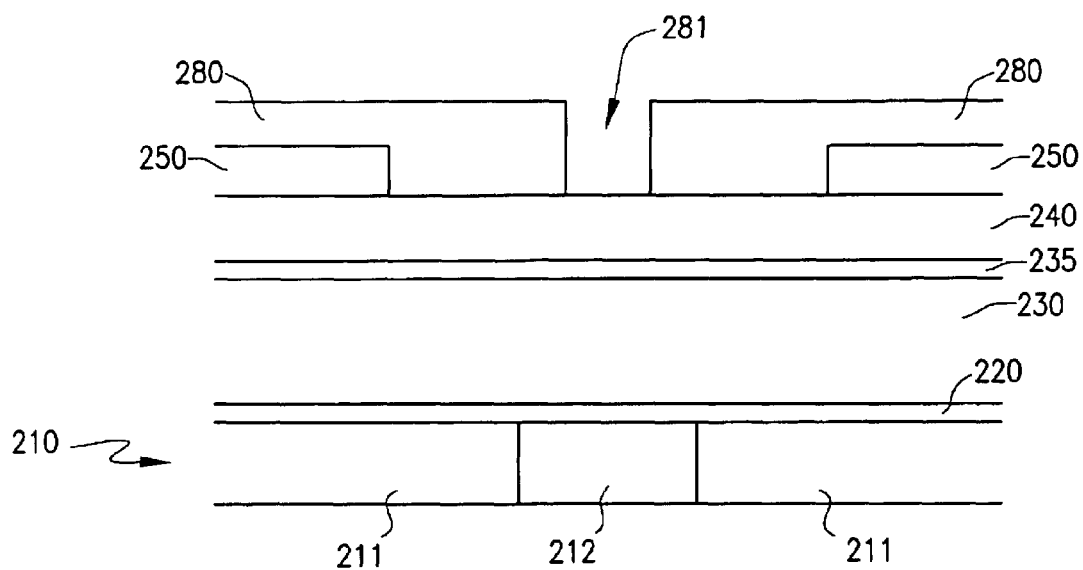
Figure 4D:
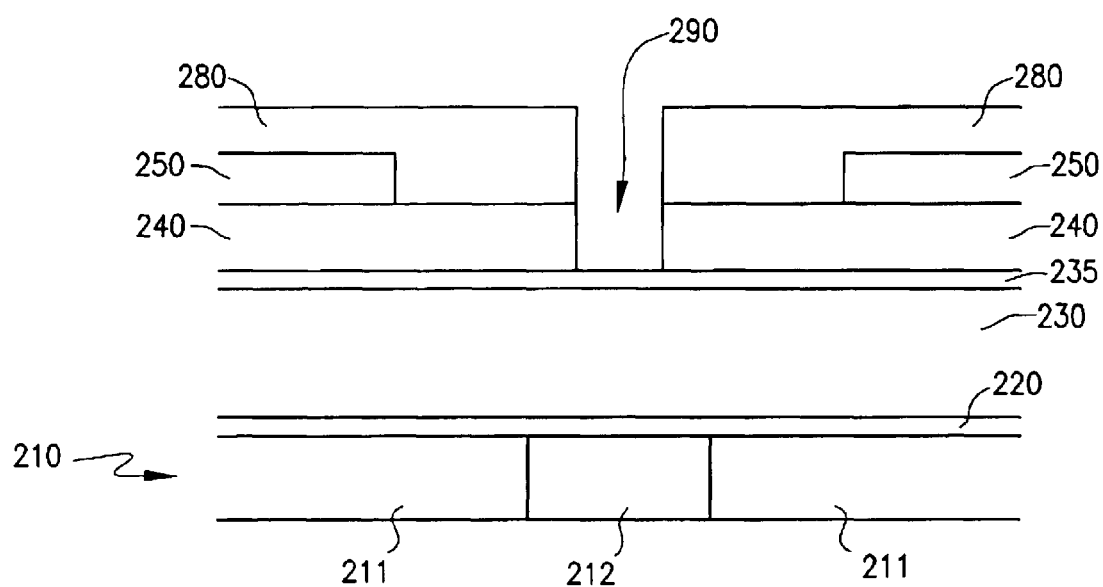
Figure 4E:
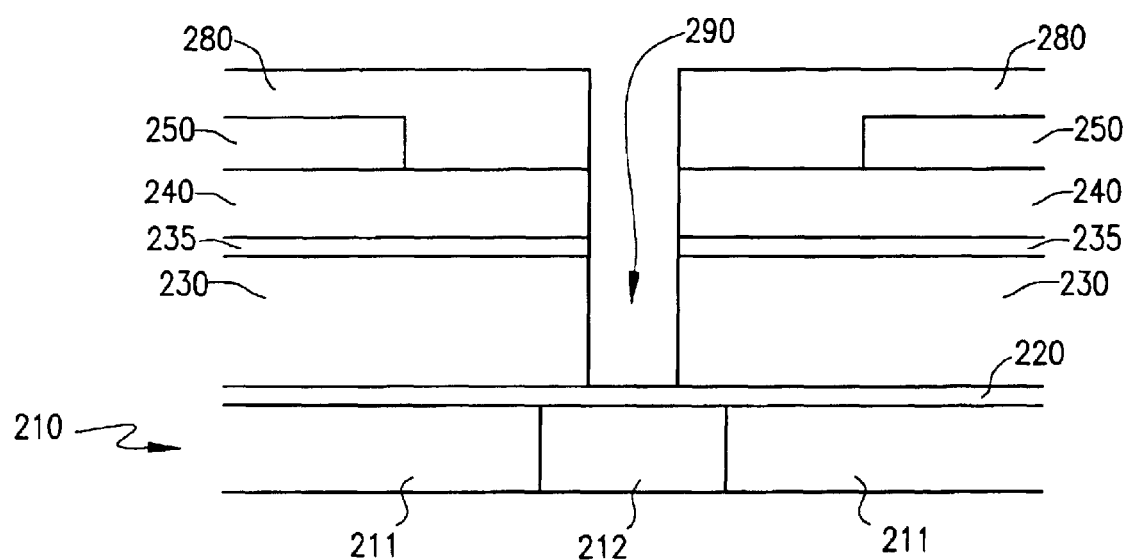
Figure 4F:
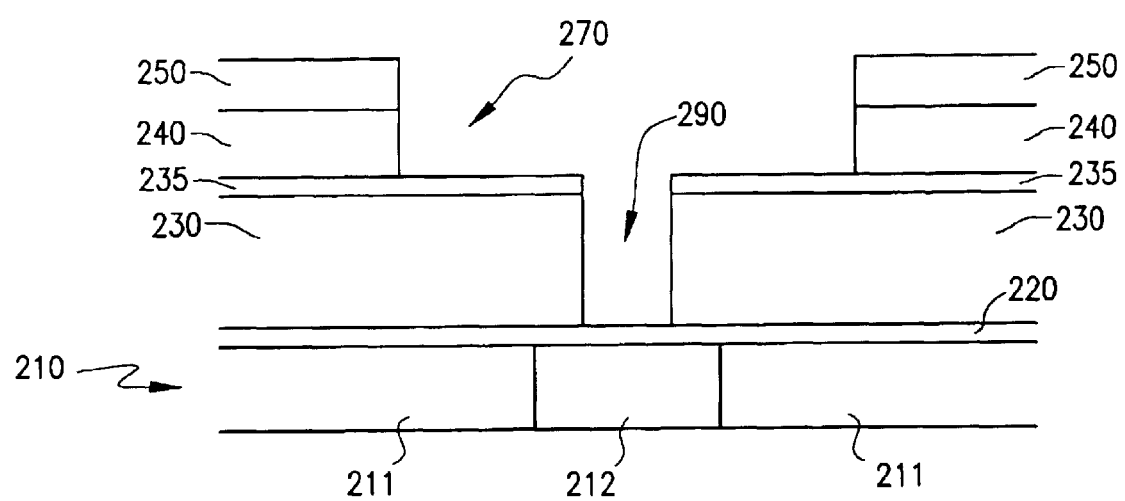
Figure 4G:
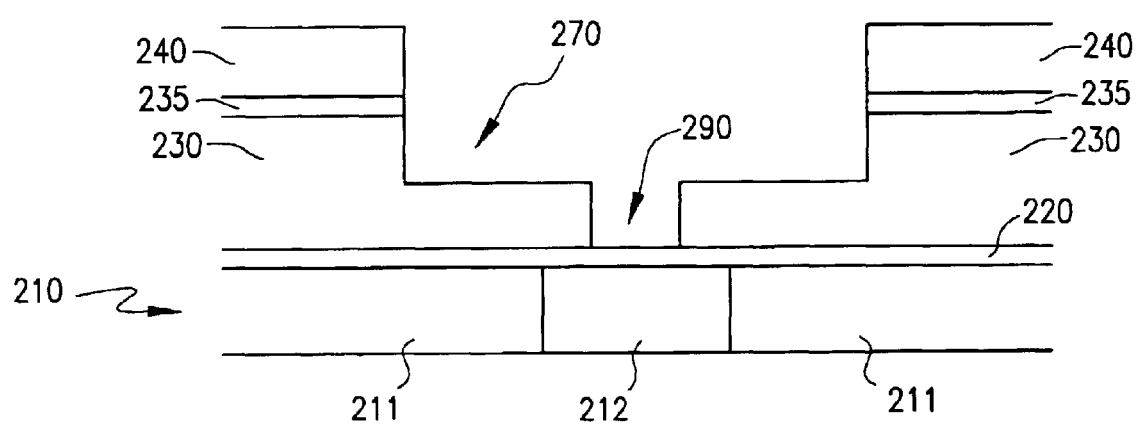
Figure 4H:
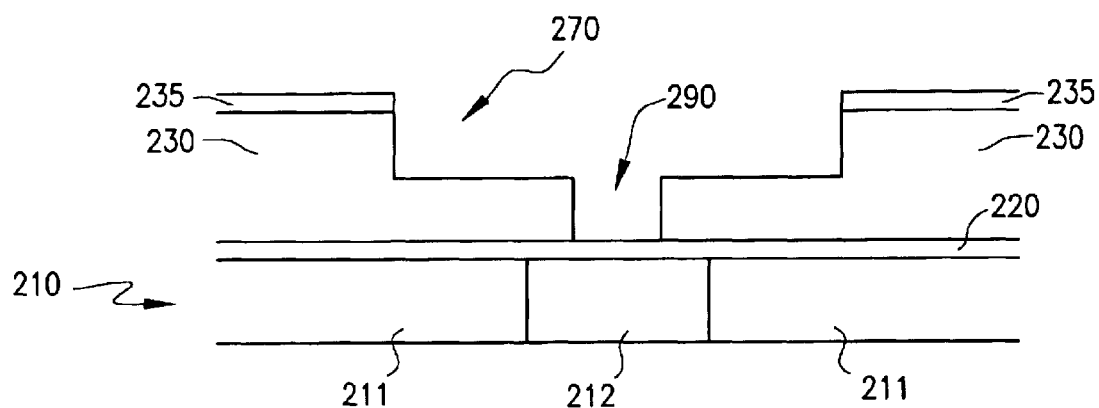
Figure 5B:
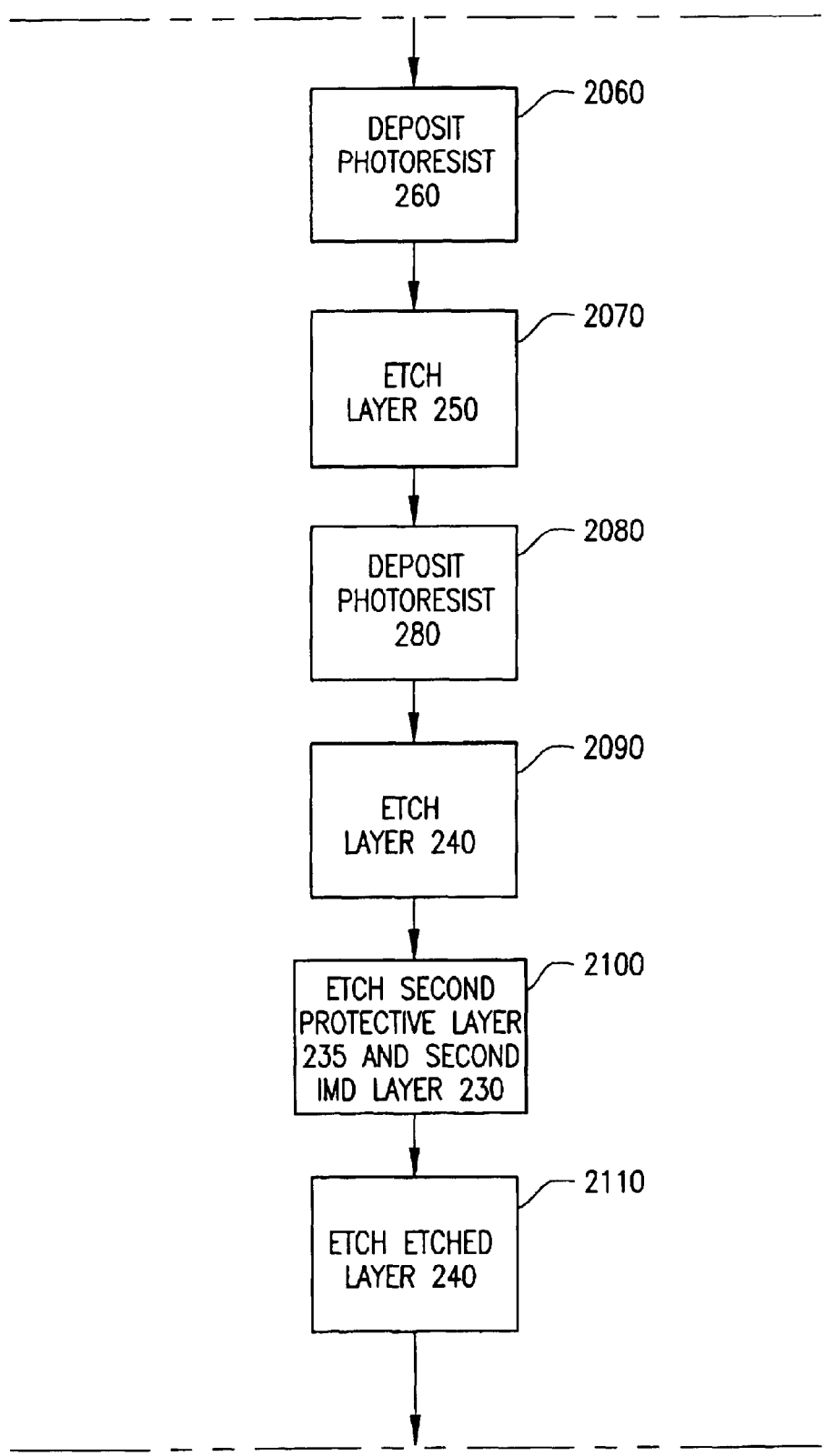
Figure 5C:
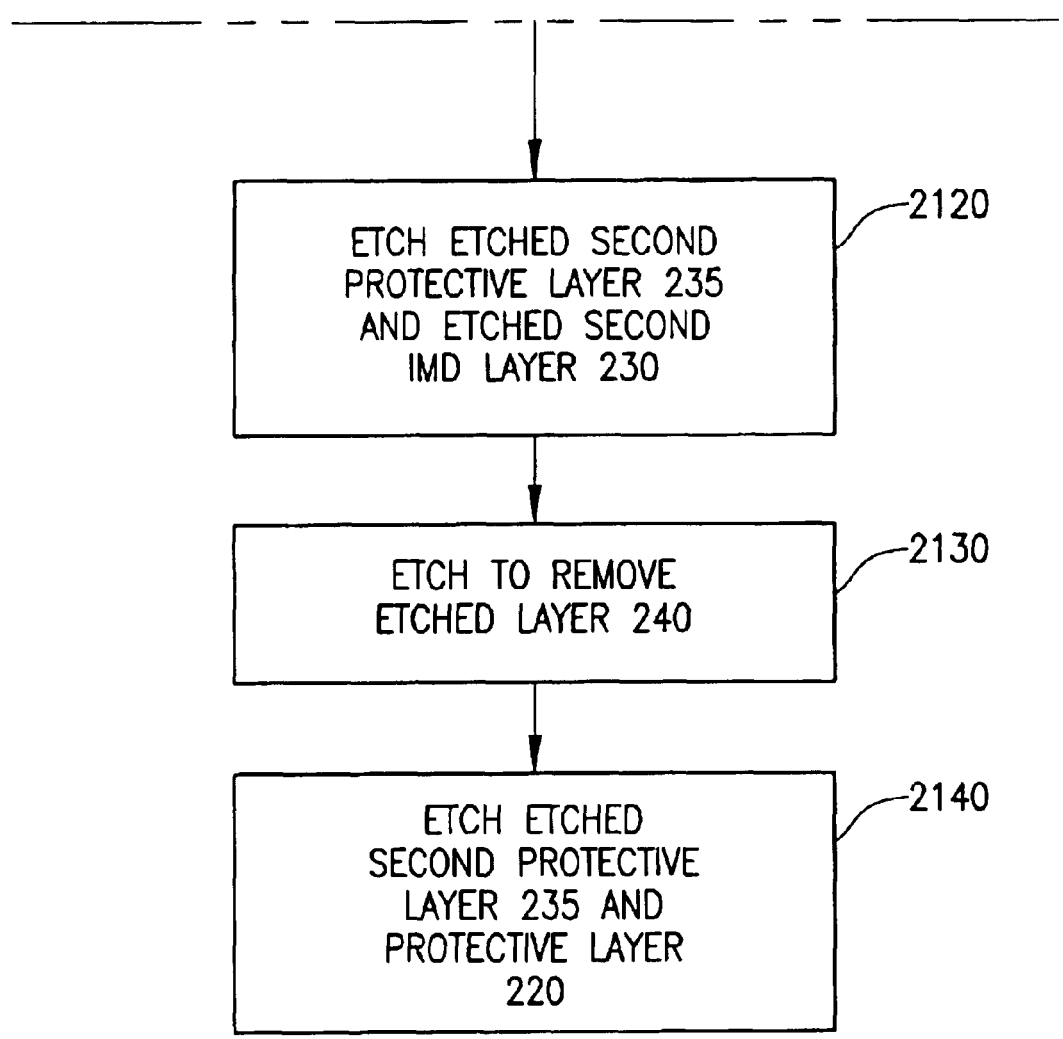
Figure 6:
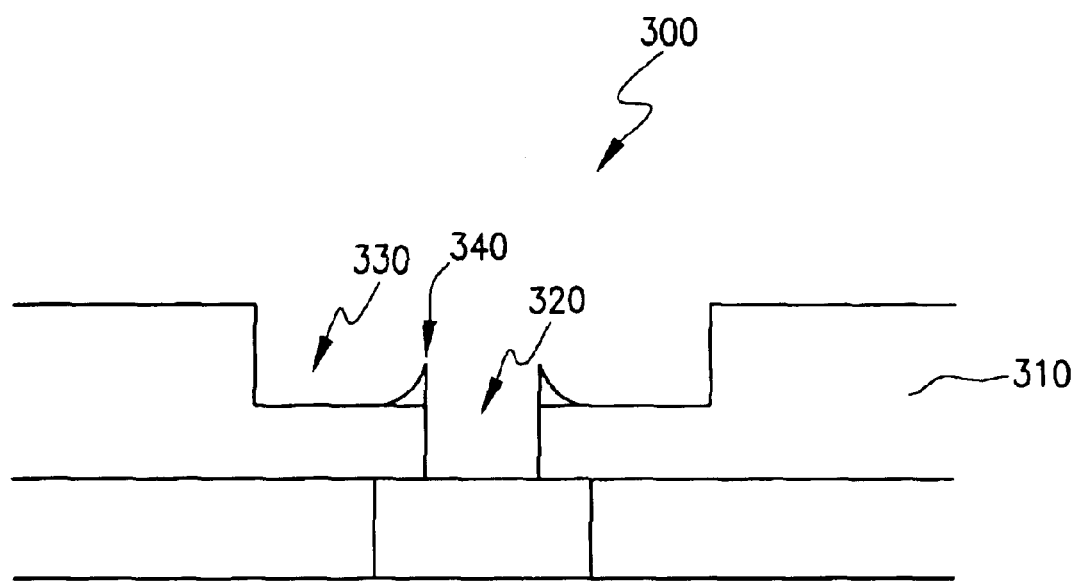
FIG. 6 is a partial cross-sectional view of a structure fabricated by a conventional method that leaves photoresist residue on the intermetal dielectric layer at the trench/via edge.

As depicted in FIG. 4A, a first layer 210 comprising a first intermetal dielectric layer 211 and a metal portion 212 is formed (step 2010). The metal of metal portion 212 may be Cu or any other metal typically employed as a multilevel interconnect. A first protective layer 220 is deposited (step 2020) upon the first layer 210. The first protective layer 220 typically comprises a material selected from the group consisting of silicon nitrides, silicon carbo-nitrides, and silicon carbides.

A second intermetal dielectric layer 230 is deposited (step 2030) upon the first protective layer 220. A second protective layer 235 is deposited (step 2035) upon the second intermetal dielectric layer 230. The second protective layer 235 typically comprises a material selected from the group consisting of silicon oxides, silicon nitrides, silicon carbo-nitrides, silicon carbides, and titanium nitrides. In another embodiment, the second protective layer 235 can be a dielectric antireflective coating. The second protective layer 235 serves to protect the underlying second intermetal dielectric layer 230 from possible contamination associated with exposure to the subsequently-deposited photoresist (described below).

A layer of amorphous carbon as a first hardmask layer 240 capable of being etched by a second etch process (described below) is deposited (step 2040) upon the second protective layer 230. A second hardmask layer 250 capable of being etched by a first etch process (described below) is deposited (step 2050) upon the amorphous carbon layer 240. Then, in the final step of assembling the layered structure prior to etching, a first layer of photoresist 260 is deposited (step 2060) upon the second hardmask layer 250 and patterned with an opening 261 through which etching will occur. Because a dual hardmask is employed, and because a second layer of photoresist 280 is employed for subsequent etching steps (described below), the photoresist layer 260 can be a relatively thin layer, having a thickness chosen to provide the optimal photo-imaging performance. The photoresist layer 260 typically has a thickness of from 1000 to 6000 Å.

The amorphous carbon layer 240, which can be deposited as a PECVD film, has a very slow etch rate for the etch chemistry associated with the material of the second hardmask layer 250 (i.e., the etch selectivity can be as high as 100:1). Furthermore, amorphous carbon can be easily etched with an etch chemistry that does not etch the second hardmask layer 250. This unique property of amorphous carbon makes it possible to use, for example, a stack of the amorphous carbon layer 240 and the second hardmask layer 250 as a dual hardmask in the present dual damascene process.

The second hardmask layer 250 typically comprises a material selected from the group consisting of silicon oxides, silicon nitrides, silicon carbo-nitrides, silicon carbides, and titanium nitrides. In another embodiment, the layer of material 250 can be a dielectric antireflective coating.

Next, in the first etching step, a first portion of a trench 270 is formed by etching (FIG. 4B)(step 2070) the second hardmask layer 250 using a first etch process. The amorphous carbon layer 240 is an excellent etch stop because amorphous carbon layer 240 is not selectively etched with the second hardmask layer 250.

The first etch process, which etches the second hardmask layer 250, typically employs a plasma containing $C_xF_yH_z$. An oxide, for example, can be easily etched by a plasma containing $C_xF_yH_z$, (e.g., $CF_4$), but is not etched at all by any of the etchants (described below) that may be used to etch the amorphous carbon layer 240.

A second layer of photoresist 280 is then deposited (FIG. 4C)(step 2080) upon the etched second hardmask layer 250 and on a portion of the amorphous carbon layer 240 and patterned with an opening 281 through which etching will occur. A first portion of a via 290 is formed by etching.(FIG. 4D)(step 2090) the amorphous carbon layer 240 using a second etch process. Because of the presence of second protective layer 235, the second intermetal dielectric layer 230 is advantageously never exposed to the photoresist 280, thus avoiding any potential poisoning reaction with the layer 230.

The second etch process, which etches the amorphous carbon layer 240, typically employs an etchant selected from the group consisting of $O_2$ plasma, $N_2$ and $O_2$ plasma, $H_2$ plasma, and $NH_3$ plasma. For example, with $O_2$ plasma, or a plasma of $N_2$ and $O_2$, the layer of material 240 can be easily etched and results in the release of $CO_2$. With $H_2$ plasma or $NH_3$ plasma, the amorphous carbon layer 240 can be easily etched and results in the release of $CH_4$.

A second portion of the via 290 is then formed by etching (FIG. 4E)(step 2100) the second protective layer 235 and the second intermetal dielectric layer 230 using the first etch process. A second portion of the trench 270 is formed by etching (FIG. 4F)(step 2110) the etched amorphous carbon layer 240 using the second etch process. In this step, the second layer of photoresist 280 is removed, and the etched second hardmask layer 250 serves as the hardmask.

A third portion of the trench 270 is formed by etching (FIG. 4G)(step 2120) the etched second protective layer 235 and the etched second intermetal dielectric layer 230 using the first etch process and thereby removing all of the etched second hardmask layer 250. In this step, the etched amorphous carbon layer 240 serves as the hardmask.

The etched amorphous carbon layer 240 is then removed by etching (FIG. 4H)(step 2130) using the second etch process. This step of etching to remove the amorphous carbon layer 240 typically employs the above-described etchant selected from the group consisting of $O_2$ plasma, $N_2$ and $O_2$ plasma, $N_2O$ plasma, NO plasma, $H_2$ plasma, and $NH_3$ plasma. Alternatively, the etching to remove the amorphous carbon layer 240 may employ a hot non-plasma etchant selected from the group consisting of $O_2$, $O_3$, $N_2O$, NO, $H_2$, and $NH_3$. Without plasma, however, the etch is isotropic, and the gaseous etchant must be employed at an elevated temperature. Other non-plasma etchants may be employed to remove the amorphous carbon layer 240, such as compounds of the formula $C_xF_yH_z$, but with these etchants the etch rate is much slower than that attainable with either the above-described plasma etchants (i.e., $O_2$ plasma, $N_2$ and $O_2$ plasma, $N_2O$ plasma, NO plasma, $H_2$ plasma, and $NH_3$ plasma) or hot non-plasma etchants (i.e., $O_2$, $O_3$, $N_2O$, NO, $H_2$, and $NH_3$).

The etched second protective layer 235 and a portion of the first protective layer 220 that is disposed above the metal portion 212 are then removed by etching (FIG. 4I)(step 2140) using the first etch process so as to complete the formation of the via 290. The resultant structure 100 is thus ready for deposition of the inlaid interconnect metal.

The etch chemistry of the photoresist layers 260 and 280 is similar to that of the etch chemistry of the amorphous carbon layer 240, but the photoresist etches faster because amorphous carbon is harder than photoresist. As indicated above, in conventional dual damascene processes, the photoresist is optimized not for imaging performance, but rather, for its etch resistance. That is, because the photoresist must be etch resistant (i.e., relatively thick) in a conventional process, the imaging qualities of the photoresist may be compromised for the benefit of etch performance. An advantage of the present invention is that because the amorphous carbon layer 240 and the second hardmask layer 250 are used as the dual hardmask, the photoresist can be made thinner and thus optimized for the best imaging performance.

The present invention is also directed to a structure 101 depicted in FIG. 2A (201 depicted in FIG. 4A) for use in fabricating a dual damascene opening according to the above-described first and second embodiments of the method of fabrication. As depicted in FIG. 2A (FIG. 4A), structure 101 (201) comprises a first layer 110 (210) comprising a first intermetal dielectric layer 111 (211) and a metal portion 112 (212). A first protective layer 120 (220) is disposed on the first layer 110 (210), and a second intermetal dielectric layer 130 (230) is disposed on the first protective layer 120 (220). A second protective layer 135 (235) is disposed on the second intermetal dielectric layer 130 (230). A layer of amorphous carbon as a first hardmask layer 140 (240) capable of being etched by a second etch process is disposed on the second protective layer 135 (235), and a second hardmask layer 150 (250) capable of being etched by a first etch process is disposed on the amorphous carbon layer 140 (240). A layer of photoresist 160 (260) is disposed on the second hardmask layer 150 (250) and has an opening 161 (261) through which etching will occur.

The present invention, therefore, provides a method and structure having several advantages over conventional dual damascene processes and structures. By virtue of the features described herein, such as the selective etch chemistry employed with the dual hardmask, the present method affords flexibility unattainable with conventional dual damascene processes. First, by virtue of the protective layers, the via, after being opened, is never in contact with the photoresist. This eliminates the "ear" formation problem at the trench/via edge which results from the presence of photoresist residue on the IMD layer.

Secondly, this processing sequence eliminates the potential "poisoning" of the IMD layer which can result from the interaction between the photoresist and the IMD layer during application of the photoresist.

Thirdly, the photolithographic imaging for both the trench and the via are completed before the IMD etch, so, if necessary, it is easy to rework any patterning misalignments to ensure that both the trench and the via are etched correctly.

Fourthly, the conventional requirement that the photoresist be etch resistant is not a constraint with the present method. That is, because the amorphous carbon layer and the second hardmask layer are used as the dual hardmask, the photoresist can be made thinner and thus optimized for the best imaging performance. Finally, because each of the hardmask layers is ultimately removed in the fabrication sequence, they do not impact the final IMD structure.

Although the invention has been described and illustrated as being suitable for use in semiconductor fabrication applications, the invention is not limited to these embodiments. Rather, the invention could be employed in any service in which the flexibility and benefits associated with the above-described features would be desirable.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed is:

1. A method of fabricating a semiconductor multilevel interconnect structure, said method comprising:
   forming a first layer comprising a first intermetal dielectric layer and a metal portion;
   depositing on said first layer a first protective layer;
   depositing on said first protective layer a second intermetal dielectric layer;
   depositing on said second intermetal dielectric layer a second protective layer;
   depositing on said second protective layer a layer of amorphous carbon as a first hardmask layer;
   depositing on said amorphous carbon layer a second hardmask layer;
   depositing on said second hardmask layer a first layer of photoresist;
   forming a first portion of a via by etching said second hardmask layer;
   forming a second portion of said via by etching the amorphous carbon layer and thereby removing the first layer of photoresist;
   depositing on said etched second hardmask layer a second layer of photoresist;
   forming a first portion of a trench by etching said etched second hardmask layer;
   forming a third portion of said via by etching the second protective layer and the second intermetal dielectric layer;
   forming a second portion of said trench by etching the etched amorphous carbon layer;
   forming a third portion of said trench by etching the etched second protective layer and the etched second intermetal dielectric layer and thereby removing all of the etched second hardmask layer;
   removing said etched amorphous carbon layer; and
   removing said etched second protective layer, and said first protective layer from above the metal portion.

2. A method according to claim 1, wherein said first protective layer comprises a material selected from the group consisting of silicon nitrides, silicon carbides, and silicon carbo-nitrides.

3. A method according to claim 1, wherein said second protective layer comprises a material selected from the group consisting of silicon oxides, silicon nitrides, silicon carbo-nitrides, silicon carbides, and titanium nitrides.

4. A method according to claim 1, wherein said second hardmask layer comprises a material selected from the group consisting of silicon oxides, silicon nitrides, silicon carbo-nitrides, silicon carbides, and titanium nitrides.

5. A method according to claim 1, wherein said second protective layer is a dielectric antireflective coating.

6. A method according to claim 1, wherein said second hardmask layer is a dielectric antireflective coating.

7. A method according to claim 1, wherein said step of forming the second portion of the via by etching the amorphous carbon layer comprises etching with an etchant selected from the group consisting of $O_2$ plasma, $N_2$ and $O_2$ plasma, $N_2O$ plasma, $NO$ plasma, $H_2$ plasma, and $NH_3$ plasma.

8. A method according to claim 1, wherein said step of removing the etched amorphous carbon layer comprises etching with an etchant selected from the group consisting of $O_2$ plasma, $N_2$ and $O_2$ plasma, $N_2O$ plasma, $NO$ plasma, $H_2$ plasma, and $NH_3$ plasma.

9. A method according to claim 1, wherein said step of removing the etched amorphous carbon layer comprises hot etching with an etchant selected from the group consisting of $O_2$, $O_3$, $N_2O$, $NO$, $H_2$, and $NH_3$.

10. A method according to claim 1, wherein said step of removing the etched amorphous carbon layer comprises etching with an etchant having the formula $C_xF_yH_z$.

11. A method according to claim 1, wherein said second hardmask layer is etched with an etchant having the formula $C_xF_yH_z$.

12. A method according to claim 1, wherein said second protective layer is etched with an etchant having the formula $C_xF_yH_z$.

13. A method according to claim 1, wherein said second intermetal dielectric layer is etched with an etchant having the formula $C_xF_yH_z$.

14. A method according to claim 1, wherein said first protective layer is etched with an etchant having the formula $C_xF_yH_z$.

15. A method according to claim 1, wherein said metal portion is Cu.

16. A method of fabricating a semiconductor multilevel interconnect structure, said method comprising:
   forming a first layer comprising a first intermetal dielectric layer and a metal portion;
   depositing on said first layer a first protective layer;
   depositing on said first protective layer a second intermetal dielectric layer;
   depositing on said second intermetal dielectric layer a second protective layer;
   depositing on said second protective layer a layer of amorphous carbon as a first hardmask layer;
   depositing on said amorphous carbon layer a second hardmask layer;
   depositing on said second hardmask layer a first layer of photoresist;
   forming a first portion of a trench by etching said second hardmask layer;
   depositing a second layer of photoresist on said etched second hardmask layer and on a portion of the amorphous carbon layer;
   forming a first portion of a via by etching said amorphous carbon layer;
   forming a second portion of said via by etching the second protective layer and the second intermetal dielectric layer;
   forming a second portion of said trench by etching the etched amorphous carbon layer;
   forming a third portion of said trench by etching the etched second protective layer and the etched second intermetal dielectric layer and thereby removing all of the etched second hardmask layer;
   removing said etched amorphous carbon layer; and
   removing said etched second protective layer, and said protective layer from above the metal portion.

17. A method according to claim 16, wherein said first protective layer comprises a material selected from the group consisting of silicon nitrides, silicon carbides, and silicon carbo-nitrides.

18. A method according to claim 16, wherein said second protective layer comprises a material selected from the group consisting of silicon oxides, silicon nitrides, silicon carbo-nitrides, silicon carbides, and titanium nitrides.

19. A method according to claim 16, wherein said second hardmask layer comprises a material selected from the group consisting of silicon oxides, silicon nitrides, silicon carbo-nitrides, silicon carbides, and titanium nitrides.

20. A method according to claim 16, wherein said second protective layer is a dielectric antireflective coating.

21. A method according to claim 16, wherein said second hardmask layer is a dielectric antireflective coating.

22. A method according to claim 16, wherein said step of forming the first portion of the via by etching the amorphous carbon layer comprises etching with an etchant selected from the group consisting of $O_2$ plasma, $N_2$ and $O_2$ plasma, $N_2O$ plasma, NO plasma, $H_2$ plasma, and $NH_3$ plasma.

23. A method according to claim 16, wherein said step of removing the etched amorphous carbon layer comprises etching with an etchant selected from the group consisting of $O_2$ plasma, $N_2$ and $O_2$ plasma, $N_2O$ plasma, NO plasma, $H_2$ plasma, and $NH_3$ plasma.

24. A method according to claim 16, wherein said step of removing the etched amorphous carbon layer comprises hot etching with an etchant selected from the group consisting of $O_2$, $O_3$, $N_2O$, NO, $H_2$, and $NH_3$.

25. A method according to claim 16, wherein said step of removing the etched amorphous carbon layer comprises etching with an etchant having the formula $C_xF_yH_z$.

26. A method according to claim 16, wherein said second hardmask layer is etched with an etchant having the formula $C_xF_yH_z$.

27. A method according to claim 16, wherein said second protective layer is etched with an etchant having the formula $C_xF_yH_z$.

28. A method according to claim 16, wherein said second intermetal dielectric layer is etched with an etchant having the formula $C_xF_yH_z$.

29. A method according to claim 16, wherein said first protective layer is etched with an etchant having the formula $C_xF_yH_z$.

30. A method according to claim 16, wherein said metal portion is Cu.

31. A method of forming an integrated circuit interconnect comprising:
   forming a multilayer structure over a conductor fabricated as part of an integrated circuit, said multilayer structure comprising a first protective layer, an insulating layer, a second protective layer, a first hardmask layer etchable by a second etch process, and a second hardmask layer etchable by a first etch process different from said second etch process;
   forming an opening in said second hard mask layer using said first etch process;
   extending the length of said opening by etching said first hardmask layer using said second etch process;
   widening said opening in said first and second hardmask layers and said insulating layer such that said opening has a wider upper portion and a narrower lower portion;
   further extending the length of the narrower lower portion of said opening through said second protective layer, said insulating layer, and said first protective layer; and
   providing a conductor material in the wider portion of said opening in said insulating layer and in the narrower portion of said opening in said first protective layer.

32. A method according to claim 31, wherein said second etch process comprises etching with an etchant selected from the group consisting of $O_2$ plasma, $N_2$ and $O_2$ plasma, $N_2O$ plasma, NO plasma, $H_2$ plasma, and $NH_3$ plasma.

33. A method according to claim 31, wherein said first etch process comprises etching with an etchant having the formula $C_xF_yH_z$.

34. A method of forming an integrated circuit interconnect comprising:
   forming a multilayer structure over a conductor fabricated as part of an integrated circuit, said multilayer structure comprising a first protective layer, an insulating layer, a second protective layer, a first hardmask layer etchable by a second etch process, and a second hardmask layer etchable by a first etch process different from said second etch process;
   forming an opening in said second hard mask layer using said first etch process;
   extending the length of said opening by etching said first hardmask layer using said second etch process such that said opening has a wider upper portion and a narrower lower portion;

further extending the length of the narrower lower portion of said opening through said second protective layer, said insulating layer, and said first protective layer;

extending the length of said wider upper portion of the opening through said first hardmask layer, said second protective layer, and said insulating layer;

further extending the length of the narrower lower portion of said opening through said second protective layer, said insulating layer, and said first protective layer; and providing a conductor material in the wider portion of said opening in said insulating layer and in the narrower portion of said opening in said first protective layer.

35. A method according to claim 34, wherein said second etch process comprises etching with an etchant selected from the group consisting of $O_2$ plasma, $N_2$ and $O_2$ plasma, $N_2O$ plasma, NO plasma, $H_2$ plasma, and $NH_3$ plasma.

36. A method according to claim 34, wherein said first etch process comprises etching with an etchant having the formula $C_xF_yH_z$.

37. A method of forming an opening for an interconnect comprising:

forming a multilayer structure over a conductor, said multilayer structure comprising a first protective layer, an insulating layer, a second protective layer, a first mask layer etchable by a second etch process, and a second mask layer etchable by a first etch process different from said second etch process; and applying a plurality of etch processes to said multilayer structure to produce an opening extending through said insulating layer and said first protective layer which has a wider portion in at least a portion of said insulating layer and a narrower portion in said first protective layer.

38. A method according to claim 37, wherein at least one of said plurality of etch processes comprises etching with an etchant selected from the group consisting of $O_2$ plasma, $N_2$ and $O_2$ plasma, $N_2O$ plasma, NO plasma, $H_2$ plasma, and $NH_3$ plasma.

39. A method according to claim 37, wherein at least one of said plurality of etch processes comprises etching with an etchant having the formula $C_xF_yH_z$.

40. A method of forming an opening for an interconnect comprising:

forming a multilayer structure over a conductor, said multilayer structure comprising a first protective layer, an insulating layer, a second protective layer, a first mask layer etchable by a second etch process, and a second mask layer etchable by a first etch process different from said second etch process; and processing said multilayer structure using said first and second etch processes to produce a dual damascene opening extending through said insulating layer and said first protective layer.

41. A method according to claim 40, wherein said second etch process comprises etching with an etchant selected from the group consisting of $O_2$ plasma, $N_2$ and $O_2$ plasma, $N_2O$ plasma, NO plasma, $H_2$ plasma, and $NH_3$ plasma.

42. A method according to claim 40, wherein said first etch process comprises etching with an etchant having the formula $C_xF_yH_z$.

* * * * *

UNITED STATES PATENT AND TRADEMARK OFFICE
CERTIFICATE OF CORRECTION

Figure 4I:
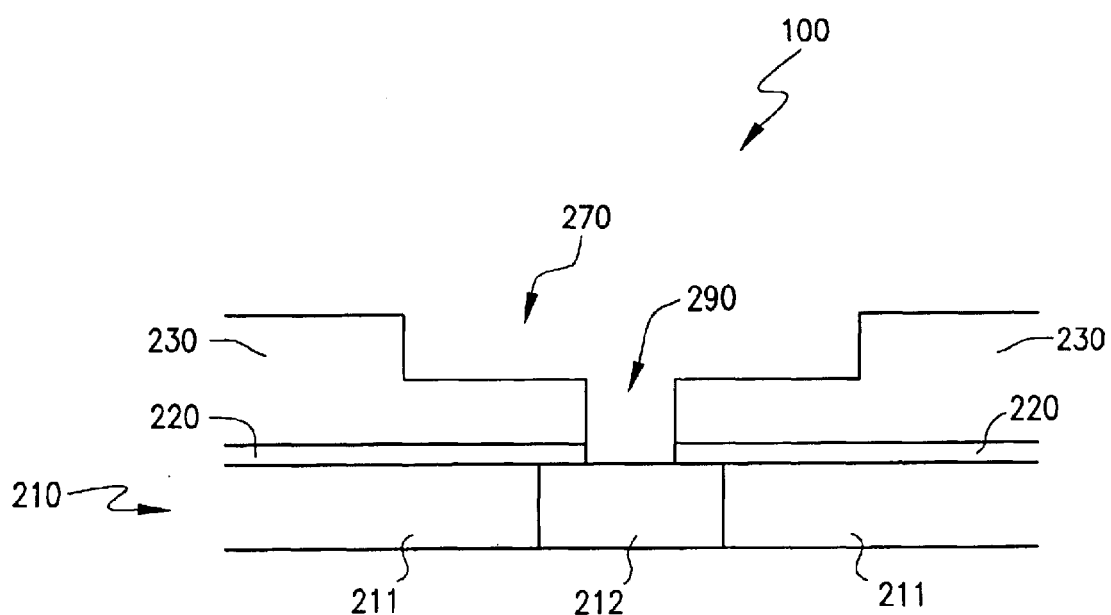

PATENT NO. : 6,951,709 B2 Page 1 of 1
DATED : October 4, 2005
INVENTOR(S) : Weimin Li It is certified that error appears in the above-identified patent and that said Letters Patent is hereby corrected as shown below:

<u>Column 8,</u>
Line 40, "FIG. 41" should read -- FIG. 4I --.

Signed and Sealed this

Twenty-seventh Day of December, 2005

JON W. DUDAS
*Director of the United States Patent and Trademark Office*